United States Patent
Gangopadhyay et al.

(10) Patent No.: US 7,879,721 B2
(45) Date of Patent: Feb. 1, 2011

(54) RAPID HEATING WITH NANOENERGETIC MATERIALS

(75) Inventors: Shubhra Gangopadhyay, Columbia, MO (US); Maruf Hossain, Columbia, MO (US); Keshab Gangopadhyay, Columbia, MO (US); Rajesh Shende, Rapid City, SD (US)

(73) Assignee: The Curators of the University of Missouri, Columbia, MO (US)

( * ) Notice: Subject to any disclaimer, the term of this patent is extended or adjusted under 35 U.S.C. 154(b) by 105 days.

(21) Appl. No.: 12/086,263

(22) PCT Filed: Oct. 27, 2006

(86) PCT No.: PCT/US2006/041690
§ 371 (c)(1),
(2), (4) Date: Dec. 17, 2008

(87) PCT Pub. No.: WO2008/048275
PCT Pub. Date: Apr. 24, 2008

(65) Prior Publication Data
US 2009/0221135 A1    Sep. 3, 2009

Related U.S. Application Data

(60) Provisional application No. 60/731,162, filed on Oct. 28, 2005.

(51) Int. Cl.
*H01L 21/44* (2006.01)
(52) U.S. Cl. .................................. 438/663; 438/660
(58) Field of Classification Search .................. 438/660, 438/663
See application file for complete search history.

(56) References Cited

U.S. PATENT DOCUMENTS 6,913,827 B2 * 7/2005 George et al. ............... 428/402

(Continued)

FOREIGN PATENT DOCUMENTS

WO    WO 2007/053397    5/2007

(Continued)

OTHER PUBLICATIONS

Baer, M,R., et. al., "Micromechanical Modeling of Heterogeneous Energetic Materials", *Eleventh Symposium (International) on Detonation*,. Aug. 1998.

(Continued)

*Primary Examiner*—Jarrett J Stark
*Assistant Examiner*—Nicholas Tobergte
(74) *Attorney, Agent, or Firm*—Greer, Burns & Crain, Ltd.

(57) ABSTRACT

The present process for rapidly heating and cooling a target material without damaging the substrate upon which it has been deposited. More specifically, target material is coated onto a first substrate. A self-propagating nanoenergetic material is selected that combusts at temperatures sufficient to change the target material and creates a flame front that propagates sufficiently quickly that the first substrate is not substantially heated. The nanoenergetic material is deposited on the target material, such that the target material and the nanoenergetic material is sandwiched between the substrate and the target material. The nanoenergetic material is ignited and the flame front of the nanoenergetic material is allowed to propagate over the second substrate and change the target material.

21 Claims, 5 Drawing Sheets

U.S. PATENT DOCUMENTS

| | | | |
|---|---|---|---|
| 6,923,946 | B2 | 8/2005 | Geohegan et al. |
| 7,608,478 | B2 * | 10/2009 | Gangopadhyay et al. .... 438/106 |
| 7,642,205 | B2 * | 1/2010 | Timans ........................ 438/795 |
| 7,700,464 | B2 * | 4/2010 | Robinson et al. ............ 438/502 |
| 2003/0096897 | A1 | 5/2003 | Nielson et al. |
| 2003/0108683 | A1 | 6/2003 | Wu |
| 2003/0145924 | A1 | 8/2003 | Carter, Jr. |
| 2007/0099335 | A1 * | 5/2007 | Gangopadhyay et al. ...... 438/99 |
| 2007/0238267 | A1 * | 10/2007 | Liu et al. .................... 438/478 |
| 2009/0178741 | A1 * | 7/2009 | Xun et al. ..................... 149/15 |
| 2009/0229857 | A1 * | 9/2009 | Fredenberg et al. ...... 174/126.2 |

FOREIGN PATENT DOCUMENTS

| | | |
|---|---|---|
| WO | WO 2007/053543 | 5/2007 |
| WO | WO 2008/045101 | 4/2008 |
| WO | WO 2008/048275 | 4/2008 |

OTHER PUBLICATIONS

Gavens, A,J., et. al., "Effect of intermixing on self-propagating exothermic reactions in Al/Ni nanolaminate foils",*Journal of Applied Physics*, vol. 87, No. 3, Feb. 1, 2000.

Merzhanov, Alexander G., "The chemistry of self-propagating high-temperature synthesis", *Journal of Materials Chemistry*,2004, 14, pp. 1779-1786.

Apperson, S., et. al., "Generation of fast propagating combustion and shock waves with copper oxide/aluminum nanothermite composites", *Applied Physics Letters*, 91, 243109, 2007.

Baer. M.R., et. al., "Micromechanical Modeling of Heterogeneous Energetic Materials", *Eleventh Symposium (International) on Detonation*, . Aug. 1998.

Beloni, Ervin, et. al., "Development of Insensitive High Energy Density Nanomaterials", *AIAA Regional I-NE Student Conference*, Cambridge, MA, Apr. 2007.

Bowden, F.P., et, al., "Initiation and Growth of Explosion in Liquids and Solids", *Cambridge at the University Press.* 1952.

Brousseau, Patrick et. al., "Nanometric Aluminum in Exposives", *Propellants, Explosives, Pyrotechnics*, 27, pp. 300-306, 2002.

Clapsaddle, B.J., et. al., "Synthesis and Characterization of Mixed Metal Oxide Nanocomposite Energetic Materials", *International Pyrotechnics Seminar*, Fort Collins, CO. Jul. 12-16, 2004.

Gash, A., et. al., "Nanostructured Energetic Materials with Sol-Gel Methods", *Materials Research Society Fall 2003 Meeting*, Boston, MA Dec. 1-5, 2003.

Jones, David E.G., et. al., "Hazard Characterization of Aluminum Nanopowder Compositions", *Propellants, Explosives, Pyrotechnics* 28, No. 3, 2003.

Kim, Soo H., et. al., "Enhancing the Rate of Energy Release from NanoEnergetic Materials by Electrostatically Enhanced Assembly", *Adv. Mater.*, 16, No. 20. Oct. 18, 2004.

Kliche, G., et al., "Far-infrared spectroscopic investigations on CuO", *Physical Review B*, vol. 42, No. 16, Dec. 1, 1990.

Kwok, Queenie S.M, et al., "Characterization of Aluminum Nanopowder Compositions", *Propellants, Explosives, Pyrotechnics*27, p. 229-240, 2002.

Laritchev, Mikhail et. al., "New Reactive Surface Coatings for Al Metal Nanoparticles", *36th Annual Conference of ICT 32$^{nd}$ International Pyrotechnics Seminar*, Jun. 28- Jul. 1, 2005.

Lessard, P., et, al., "Burn Rate Studies of Composite Propellants Containing Ultra-Fine Metals", *Energetic Materials*, 2001.

Lewis Jr., David H., et. al., "Digital MicroPropulsion", *Twelfth IEEE International Conference on Micro Electro Mechanical systems*, 1999.

Merzhano, Alexander G., "The chemistry of self-propagating high-temperature synthesis", *Journal of Chemistry*, 14, p. 1779-1786, 2004.

Moore, J.J., et. al., "Exothermic Reaction Synthesis of Composite Materials", *Synthesis/processing of lightweight metallic materials; proceedings of a symposium held during the TMS annual meeting in Las Vegas*, Feb. 1995, p. 295-310.

Munir, Zuhair A., et. al, "Self-Propagating Exothermic Reactions: The Synthesis of High-Temperature Materials by Combustion", *Materials Science Reports*, 3, p. 277-365, 1989.

Raman, Narayan K., et. al., "Template-Based Approaches to the Preparation of Amporphus, Nanoporous Silicas", *American Chemical Society*, 1996.

Redner, Paul, et. al., "The Development of Energetic Nanocomposites for the Warfighter", *Nano-Engerectic Materials 2005 Annual Meeting*, Cleveland, OH, 2005.

Senturia, Stephen D., "Microsystem Design", *Kluwer Academic Publishers*, Boston/Dordrecth/London, 2001.

Sheffield, S. A., "Particle Velocity and Stress Measurements in Low Density HMX", *American Institute of Physics*, 1994.

Shende, Rajesh et. al., "Nanoenergetic composites of CuO Nanorods, Nanowires, and Al-nanoparticles", *Propellants, Explosives, Pyrotechnics*, vol. 33, Issue 2, p. 122-130, Apr. 2008-published online Mar. 13, 2008.

Stewart, D. Scott, "Miniaturization of Explosive Technology and Microdetonics", *XXI ICTAM*, Aug. 15-24, 2004, Warsaw, Poland.

Venkatasubramanian, Rama, et. al., "Thin-film thermoelectric devices with high room-temperature figures of merit", *Nature* , vol. 413, Oct. 2001.

Zhang, Kaili, et. al., "MEMS-Based Solid Propellant Microthruster Design, Simulation, Fabrication and Testing", *Journal of Microeletromechanical Systems*, vol. 13, No.2, Apr. 2004.

* cited by examiner

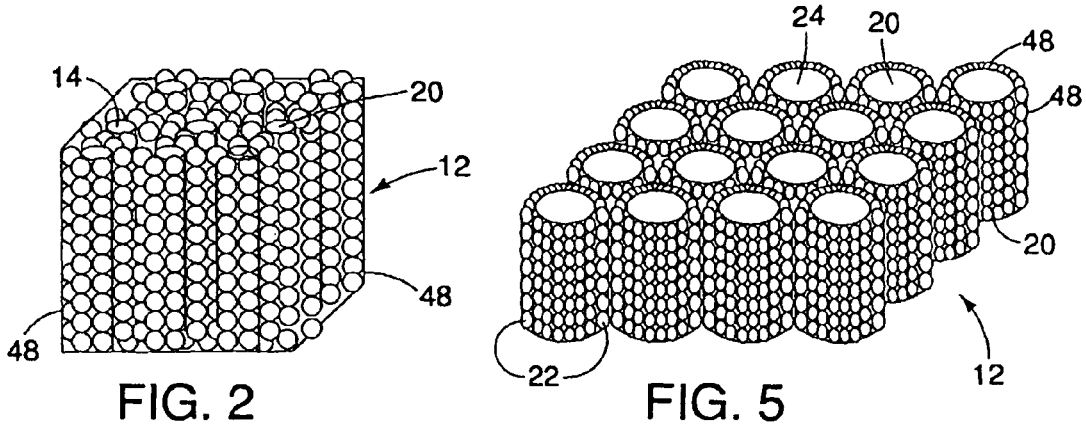
FIG. 2
FIG. 5
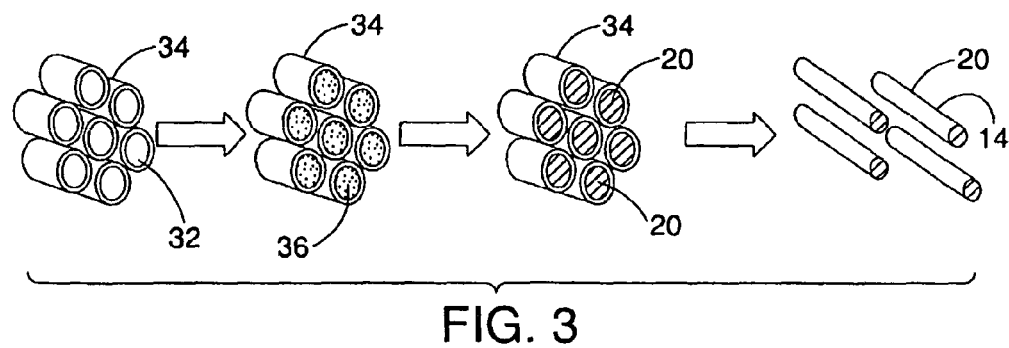
FIG. 3
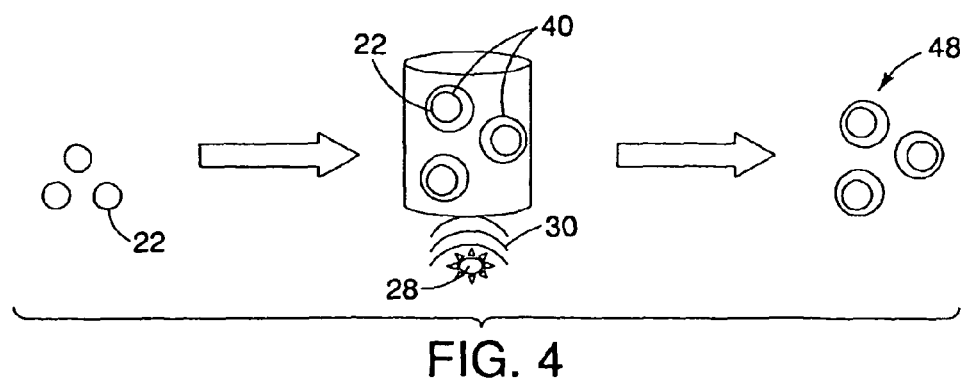
FIG. 4

RAPID HEATING WITH NANOENERGETIC MATERIALS

CROSS REFERENCE TO RELATED APPLICATION

This application claims the benefit of U.S. Provisional Application 60/731,162, filed Oct. 28, 2005.

STATEMENT OF GOVERNMENT INTEREST

This invention was made with Government assistance under ARMY DAAE 30-02-C-1132 awarded by the ARMY. The Government has certain rights in this invention.

TECHNICAL FIELD

This invention relates to a method of rapidly heating a target material to effect a change in it. More specifically, the target material is deposited on a substrate and the heating of the target material occurs so rapidly that the temperature of the substrate is not substantially raised above room temperature.

BACKGROUND ART

Poly-crystalline silicon is a very promising target material when deposited on a flexible substrate for fabricating solar cells and thin film transistors. Thin-film transistors have huge markets in flat panel television or liquid crystal displays that are used in a number of electronic devices. The large market for these devices makes it desirable to develop a low cost method of making these and other devices that utilize a high temperature treatment for the target material, but where the substrate upon which the target material resides does not tolerate high temperatures well.

Conventional doping of semiconductor material includes diffusion and ion implantation. In situ doping of semiconductor material during deposition is also another doping technique. Doping by diffusion is a high temperature process; hence, it is not suitable for fabricating devices of glass or plastic substrate. Ion implantation is a technique where dopant is injected directly into the material lattice. In situ doping during deposition creates a hetero-junction and can cause interface problem.

Polycrystalline silicon can be prepared by crystallization of amorphous silicon by various techniques. Polycrystalline silicon can be deposited directly onto the substrate by low pressure chemical vapor deposition ("LPCVD"). Solid phase crystallization is another technique that has been used. The main problem in these techniques is the processing temperature. The usual deposition temperature of this technique is around 600° C. The grain size of the deposited film is usually in the range of 30 to 100 nm for LPCVD and in the range of 200 nm to 400 nm for solid phase crystallization. The processing temperature eliminates the use of many plastic substrates that are otherwise ideal for these applications.

Researchers have studied laser crystallization. The major disadvantage of laser crystallization is its low throughput due to the small laser spot size, which is not suitable for large area device like solar cells. Because of the pin-point heating, the laser has to be moved many times, perhaps thousands of times for a large substrate. Movement of the laser has to be precise to cover all of the target material and obtain a treated target material with few defects. This process is very expensive and time-consuming. If the laser is not aimed accurately, there will be areas of unconverted target material and a large portion of impurities.

Other possible treating methods include hydrogen-induced crystallization and metal-induced crystallization. Hydrogen induced crystallization involves high temperature deposition and is not suitable for plastic substrates. Metal induced crystallization also requires high temperatures of more than 180° C. for fabricating good quality poly-silicon. Another major problem of this technique is metal contamination of the film. Pt/Al alloys can be achieved by high temperature annealing.

Energetic materials such as explosives have been examined by several researchers to crystallize various bulk amorphous materials. Some explosives are unsuitable as they produce sufficient energy to destroy the device to which they are attached. Others are not self-propagating so that, when used in thin layers, combustion of one section of the layer does not automatically ignite adjacent parts of the film.

DISCLOSURE OF THE INVENTION

The above-listed needs are met or exceeded by the present process for rapidly heating and cooling a target material without damaging the substrate upon which it has been deposited. More specifically, target material is coated onto a substrate. A self-propagating nanoenergetic material is selected that combusts at temperatures sufficient to change the target material and creates a flame front that propagates sufficiently quickly that the substrate is not substantially heated. An igniter is positioned over at least a portion of the nanoenergetic material. The nanoenergetic material is then deposited over at least a portion of the igniter and over at least a portion of the target material to be converted. The nanoenergetic material is ignited and the flame front of the nanoenergetic material is allowed to propagate over the target material to change it.

The major advantage of this technique is that the substrate remains substantially at ambient temperature. For this reason, low cost plastic substrates can be used to fabricate semiconductor devices with this technique. There will be a great impact of this invention on the economy because of the cost effective fabrication process. Where the target material is polycrystalline silicon, amorphous silicon is crystallized at temperatures of 200° C. or more. The heat dissipates sufficiently quickly that the first substrate is not damaged as the silicon is heated to crystallization temperature. This process allows for an economical use of plastics as flexible substrates for thin film transistors and solar cell panels. Because the crystallization occurs rapidly, the process is much more economical than using a laser for pin-point heating. Since only the target material is heated to the temperature needed to change it, the process can take place with all other components at room temperature. No excess fuel is needed to heat the entire substrate to crystallization temperatures.

This process is also useful for making metal alloys at ambient temperatures. Two or more metals are deposited on the substrate and subsequently heated by combustion of the nanoenergetic material. Only the metals are heated. They are heated to a uniform temperature and the entire field of target materials are heated, even on a very large substrate. This technique is also useful for doping of semiconductors.

BRIEF DESCRIPTION OF THE DRAWINGS

FIG. 2 is a schematic drawing of a self-assembled nanoenergetic material including nanorods;

FIG. 3 is a schematic drawing showing the steps for making a nanorod;

FIG. 4 is a schematic drawing showing the steps for coating nanoparticles with the molecular linker;

FIG. 5 is a schematic drawing of a self assembled nanoenergetic material including nanowells;

BEST MODE FOR CARRYING OUT THE INVENTION

Rapid heating and cooling of a target material deposited on a substrate allows a wider range of substrates to be used in a variety of applications. Any target material is used where heat treating of the target material changes it to produce a beneficial result. In some embodiments, heat treating of an amorphous material crystallizes it. Examples of target materials that benefit from crystallization include silicon and carbon. Other embodiments of this process allow alloying of two or more metals. The alloy is prepared by depositing a layer of an alloying metal adjacent to the metal target material prior to ignition. Rapid heating of the metals by the nanoenergetic material causes them to melt into a homogeneous liquid. The alloy forms as the liquid cools and recrystallizes. An example of an alloy that is made by this process is an alloy of aluminum and platinum. Other suitable target materials include graphite, carbon nanotubes and fullerenes.

Doping of semi-conductor or insulator materials is another process that is adaptable to this technique. A large area film of silicon, silicon carbide, gallium arsenide, diamond, aluminum nitride, zinc oxide is deposited on a substrate, then doped with phosphorous, boron, nitrogen, carbon, silicon, oxygen, germanium. From these examples, it will be clear to an artisan that the target material is any element, compound or combination thereof that benefits by rapid heating and cooling to change it. The change in the target material can be crystallization, doping, alloying, polymerization, phase change or any other change that occurs due to heating of the target material.

Figure 1:
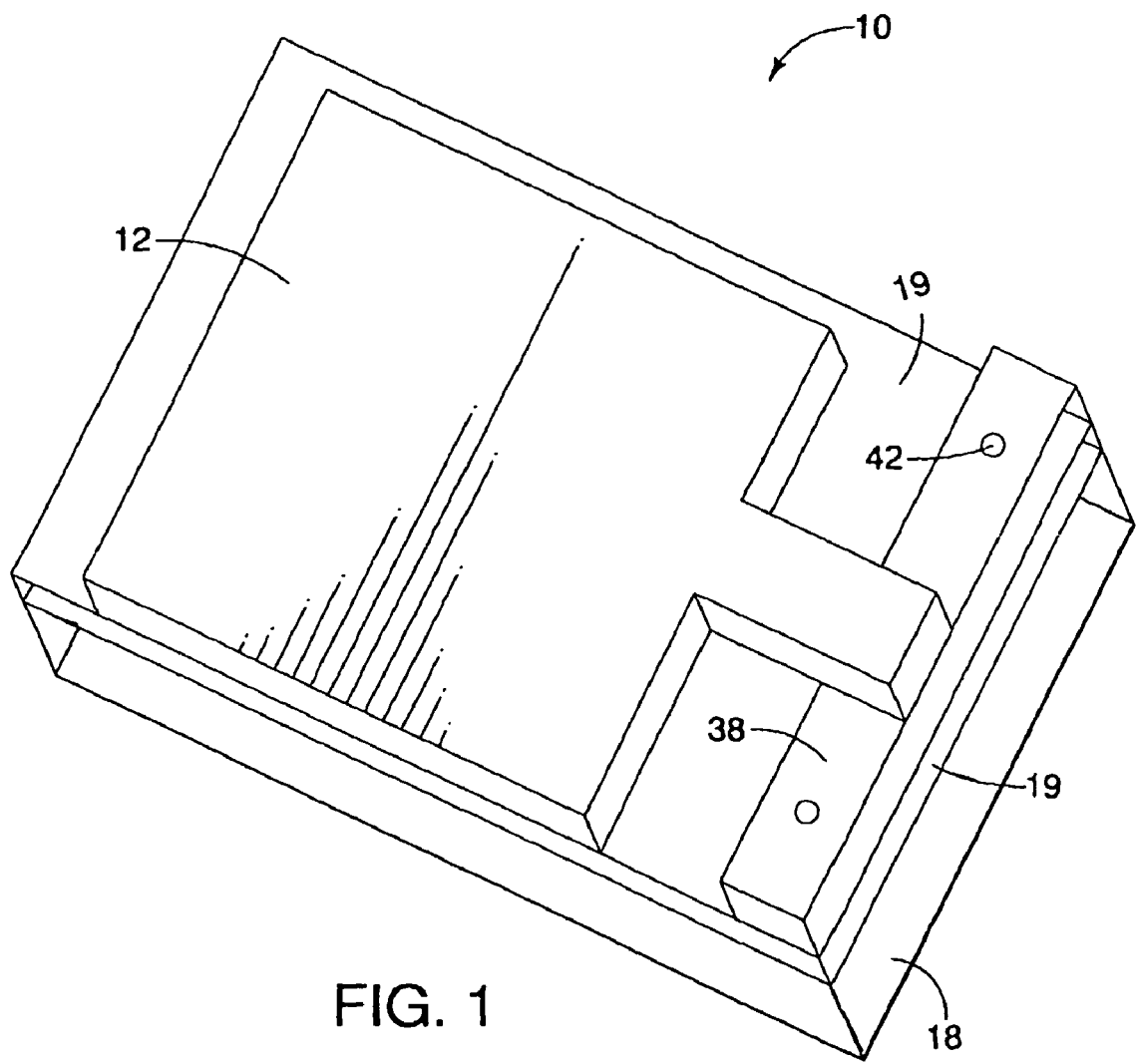
FIG. 1 is a perspective view of an apparatus designed to utilize the steps of one embodiment of this invention.

Referring to FIG. 1, a device, generally 10, is shown that carries out some steps of the process of the invention. The target material 19 is coated on a substrate 18. Any substance that can support the target material 19 at room temperature is useful as the substrate 18. Another characteristic of the substrate 18 is that it should not react with the target material in a manner that reduces the quality of the final product. The ability to use substrates 18 that do not hold up to high temperatures is a huge advantage of this process. Preferred substrates include glass, perforated glass, silicon and plastics due to their low cost, chemical inertness and ready availability. Flexible plastics are preferred for some applications, such as liquid crystal displays in electronic devices. Preferred plastics include LEXAN® brand polycarboxylate and polyethersulphone. By this technique, large substrates can be used for large solar panel fabrication or microchips can be fabricated due to the increased flexibility in selection of the substrate.

Deposition of the target material onto the substrate is carried out by any method that places a layer of target material onto the substrate with sufficient thickness to produce an appropriate product after the heat treatment. Selection of a particular deposition method depends on the target material and the substrate selected. When amorphous silicon is selected, Laser Enhanced Chemical Vapor Deposition ("LECVD") is a preferred deposition technique. It is within the knowledge of one skilled in the art to select other deposition techniques, if necessary, for other materials being used.

A self-propagating nanoenergetic material, generally 12, is selected that combusts at temperatures sufficient to change the target material 19 and creates a flame front that propagates sufficiently quickly that the substrate 18 is not substantially heated. For some embodiments, nanorods and nanowells are physically mixed to create a self propagating material. In other embodiments, fuel and oxidizer components are self-assembled into an organized particular. The nanoenergetic particle is preferably a thermite composition, utilizing a metal fuel and an oxidizer. Other preferred nanoenergetic particles include metastable intermolecular composites and SHS composites. Energetic materials are those that rapidly convert chemical enthalpy to thermal enthalpy. These materials are commonly known as explosives, propulsion fuels and pyrotechnics. Thermite is a well-known subgroup of pyrotechnics. It is a combination of a fuel and an oxidizer that combusts in a self-propagating reaction producing temperatures of several thousand degrees. Either alone or in combination with other high energy materials, thermites are used for various applications that include military, mining, demolition, precision cutting, explosive welding, surface treatment and hardening of materials, pulse power applications, sintering-aid, biomedical applications, microaerospace and satellite platforms. In solid form, thermite is often a first metal and the oxide of a second metal, such as aluminum and iron oxide.

Self-propagating high temperature synthesis ("SHS") relates to the synthesis of compounds that combust in a wave of chemical reaction that propagates over the reactants, producing a layer-by-layer heat transfer. Properties such as burn rate, reaction temperature and energy release are very important. In powder-based SHS materials, solid fuel and oxidizer are ground into fine micron-sized particles and combined. In these systems, reactions depend strongly on the interfacial surface area between the fuel and the oxidizer which is affected by the size, impurity level and packing density of the constituent powders. Since the particle size predominates in determining particle surface area, use of smaller particles is desirable to increase the burn rate of the SHS and metastable intermolecular composites ("MIC") material.

Even if smaller particle size is achieved, mixing of the fuel and the oxidizer is not sufficient to guarantee an increase in the interfacial surface area. Mixing of the powders results in a random particle distribution. In such a distribution, many of the fuel particles will be surrounded by other fuel particles. There will be many places where the oxidizer has little contact with fuel particles. To increase the extent of reaction further, the particles are specifically arranged so that a large number of fuel particles contact oxidizer particles and vice versa.

The propagation rate or energy release rate is increased by homogeneous distribution of the oxidizer and the fuel in the composite. This provides high interfacial area for fuel and oxidizer as well as reduced interfacial diffusional resistance. Thus on initiating a thermite reaction, the combustion wavefront assumes maximum hot spot density resulting in a high rate of energy release. In other words, such materials would show a higher burn rate or flame propagation rates. To have homogeneous distribution of the oxidizer and fuel, a self-assembly process can be very useful. Although a similar process has been demonstrated in several different research areas, preparation of ordered nanoenergetic structures has not been shown. In the self-assembly process, fuel particles are arranged in an orderly manner around oxidizer or vice versa.

In the SHS system, the reaction rate and associated heat release is described as $\partial\eta/\partial t = (1-\eta)n \cdot \exp(-m\eta) \cdot k \cdot \exp[-E/$ (RT)], where η is the degree of chemical conversion (0≦η≦1), n, m and k are reaction constants and E is the activation energy. This approach permits analyzing the dynamic regimes of SHS waves (e.g., oscillating or spin combustion) but it does not necessarily provide information on the phase formation mechanisms. In many SHS-systems, E values calculated from the dependence of the SHS wave velocity, v, on temperature (v/Tc vs. 1/Tc where Tc is the combustion temperature) appear to be close to the activation energy for solid-state diffusion. Thus, a diffusion-controlled growth mechanism is accepted for a quasi-equilibrium product phase (e.g. molten) formation on any surface. The interfacial heat transfer and cooling processes are responsible for the phase stabilization in heterogenous crystallization.

Under dynamic conditions involving a direct contact of solid surface with molten phase of MIC combustion, a continuous interface layer separating the surface and products can operate in the SHS wave. In this situation, the formation of dense product can occur via partial dissolution or doping of molten products in the amorphous grains. At this point, the liquid side diffusion mass transfer is not a rate-limiting stage. However, the phase-forming process is responsible for major heat release. The heat release rates in SHS system involving MIC materials are of the order of few microseconds, which believe that there is instantaneous phase stabilization due to proportional cooling rates similar to quenching. This mechanism qualitatively agrees with the experimental results disclosed in this invention on the phase formation while SHS system propagating over the amorphous Si substrate during heterogeneous crystallization. If the propagation rates of MIC materials are controlled, a more precise crystalline growth can occur.

Figure 8:
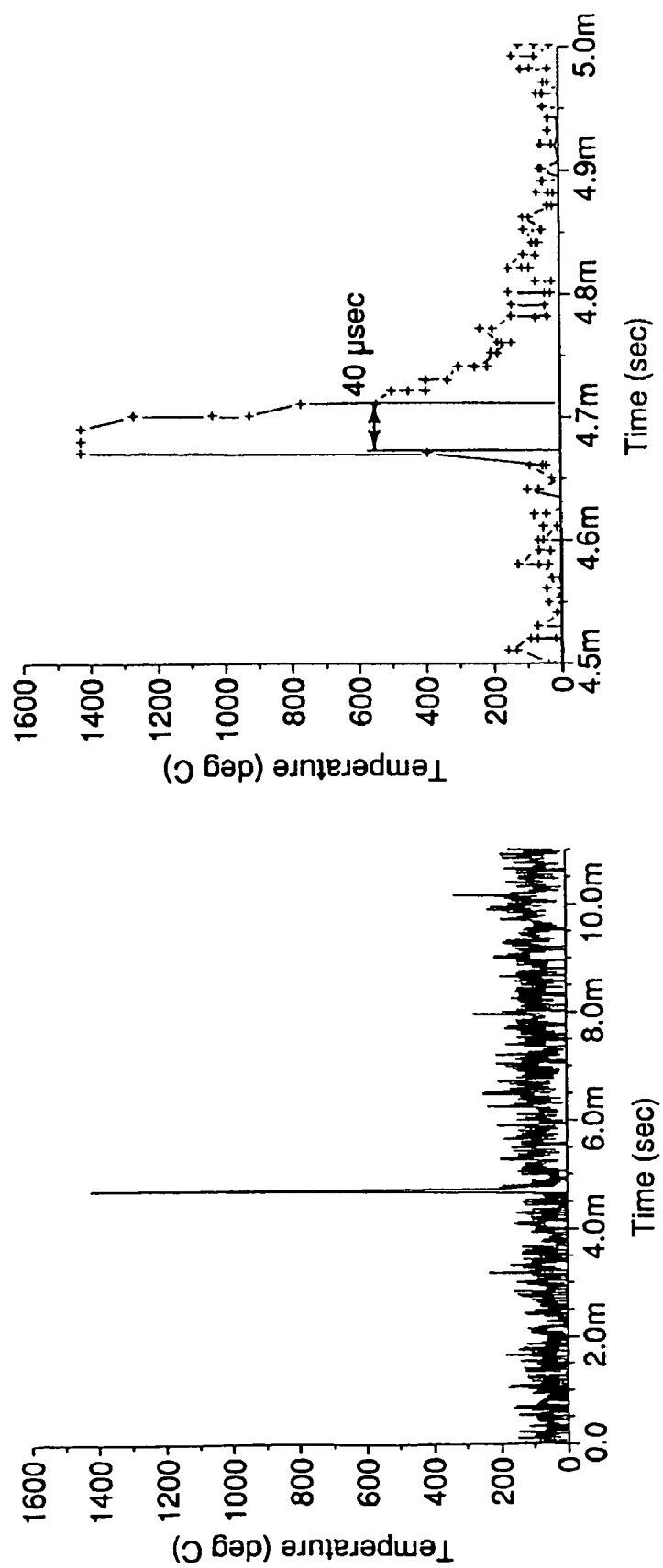
FIG. 8 is a temperature plot of a passing thermite flame front.

The temperature pro-files from MIC materials, for example CuO nanorods/Al-nanoparticles, indicate rapid rise in the temperature to about 1400° C. and decrease to less than 600° C. after 40 ms. This cooling rate of 20° C./s or 1200° C./min is almost instantaneous for phase stabilization in heterogenous crystallization. FIG. 8 shows the rapid change in both heating and cooling during the combustion reaction. These temperature considerations should be taken into account when selecting the nanoenergetic material to produce a particular change in a target material.

It may also be advantageous to use more than one layer of nanoenergetic material. Two or more layers of thermite can be placed as adjacent layers on the substrate. In some cases, the self propagating reaction with metal/metal multilayer structure cannot be sustained by the usual way of heating a Pt heater with a voltage source. Metal/metal thermites, such as platinum/aluminum thermites, usually have slow self propagating reactions in the range of 1-10 cm/sec. The heat losses to the substrates may be the reason that these thermite when deposited on the substrates cannot sustain the self propagating reaction. Where this occurs, fast burning thermites, such as CuO/Al nano-engineered thermites, are coated on top of the Pt/Al multilayer structure to initiate the uniform reaction in Pt/Al thermite using the released heat of CuO/Al thermites. Other uses for multiple thermite layers are also contemplated.

Although solid spherical nanoparticles of both the oxidizer and fuel can be assembled to create a nanoenergetic composite, generally 12, the surface area in spherical nanoparticles is generally smaller than cylindrical shaped nanoparticles. In cylindrical oxidizer nanoparticles such as nanorods 14, it is possible to assemble a greater number of fuel nanoparticles 22 than spherical oxidizer nanoparticles. Such composites result in higher energy density than spherical particle assembly and releases energy through conduction mechanism. In the case of porous oxidizer, such as a sol-gel oxidizer, convection generally improves the performance. Recent inventions by others provide a technique of mixing of fuel nanoparticles during gelation of oxidizers, but in these reports, the microstructures do not show homogenous distribution of fuel nanoparticles inside porous oxidizers.

The efficacy of the nanoenergetic particle increases as the purity of the components increases, so the preferred oxidizer and fuel are both relatively high purity. In the discussion that follows, the fuel nanoparticle is described as being shaped into a nanosphere and the oxidizer is shaped into a nanostructure, such as a nanorod 14, nanowire (not shown) or nanowell 24. These are preferred embodiments of the invention, but are not intended to be limiting in any way. Use of the fuel as a nanorod or nanowell and spherical oxidizer particles is also contemplated. The fuel and the oxidizer are suitably formed into any shapes that are complimentary to each other, and that increase the interfacial surface area compared to a random particle distribution.

Any nanoenergetic materials are suitable for use on the microchip. The nanoenergetic material is deposited on at least a portion of the target material that is intended to be changed by the combustion reaction. Deposition takes place by any known process, including spin coating. In some embodiments utilize multiple layers of nanoenergetic material where some nanoenergetic layers are directly deposited on another nanoenergetic material. Preferably, substantially all of the target material is coated with the nanoenergetic material. At least a portion of an igniter is also coated with the nanoenergetic material so that it ignites when the igniter is activated, combustion of the nanoenergetic material begins.

Thermites are preferred nanoenergetic materials. They include the fuel and the oxidizer. The most preferred nanoenergetic materials are specifically shaped particles that fit compactly together and are assembled having high interfacial surface areas that promote a stoichiometric ratio of the fuel and the oxidizer even at the nanoparticle level.

A wide variety of fuels are useful in this invention. Where the nanoenergetic particle is a thermite, the preferred fuel is a metal. Preferred metals include aluminum, boron, beryllium, hafnium, lanthanum, lithium, magnesium, neodymium, tantalum, thorium, titanium, yttrium and zirconium. Metals having a relatively low melting temperature are preferred so as to increase the speed at which they burn. The use of two or more metals, either physically mixed or alloyed, is contemplated.

The fuel is optionally formed into a shape, such as a sphere, that allows the fuel to bind compactly with the optional molecular linker 40. Sonication is the preferred method for shaping the fuel particles. Fuel is placed in water and positioned within the sonic field. When activated, the sound waves 30 disperse the fuel, creating extremely small particles that are often substantially monoparticles comprising a single atom or molecule of fuel. The high degree of dispersion creates an extremely high fuel surface area. Other shapes, or larger particles, are useful in applications where the extremely fast burn rate is not required.

The oxidizer 20 should be selected to burn rapidly with the chosen fuel. The fuel and the oxidizer are chosen to assure that a self-propagating reaction takes place. As long as the fuel has a higher free energy for oxide formation than the oxidizer, an exothermic replacement reaction will spontaneously occur. Preferred oxidizers include copper oxide ($CuO$ or $Cu_2O$), silver oxide ($AgO$ or $Ag_2O$), boron oxide ($B_2O_3$), bismuth oxide ($Bi_2O_3$), cobalt oxide ($CoO$), chromium oxide ($CrO_3$), iron oxide ($Fe_2O_3$), mercuric oxide ($HgO$), iodine oxide ($I_2O_5$), manganese oxide ($MnO_2$), molybdenum oxide ($MoO_3$), niobium oxide ($Nb_2O_5$), nickel oxide ($NiO$ or $Ni_2O_3$), lead oxide ($PbO$ or $PbO_2$), palladium oxide ($PdO$), silicone oxide ($SiO_2$), tin oxide (SnO or $SnO_2$), tantalum oxide ($Ta_2O_5$), titanium dioxide ($TiO_2$), uranium oxide ($U_3O_8$), vanadium oxide ($V_2O_5$) and tungsten oxide ($WO_3$).

Optimally, the amounts of fuel 22 and oxidizer present in the thermite are in a stoichiometric ratio for combustion of the fuel with the oxidizer. Preferred ratios of fuel to oxidizer range from about 1.4 to about 1.8.

Suitable molecular linker polymers 40 include polyvinyl pyrrolidone, poly(4-vinyl pyridine), poly(2-vinyl pyridine), poly(ethylene imine), carboxylated poly(ethylene imine), cationic poly(ethylene glycol) grafted copolymers, polyaminde, polyether block amide, poly(acrylic acid), cross-linked polystyrene, poly(vinyl alcohol), poly(n-isopropylacrylamide), copolymer of n-acryloxysuccinimide, poly(acrylontrile), fluorinated polyacrylate, poly(acrylamide), polystyrene-poly(4-vinyl)pyridine and polyisoprene-poly(4-vinyl)pyridine. The use of the molecular linker 40 with binding sites is a good method for self-assembly, because each polymer molecule has numerous binding sites. Therefore, when a molecular linker is adsorbed on a surface it has many more binding sites for binding other nanoparticles. Poly(4-vinyl pyridine) and its analogues are attractive to create self-assembled structures. The pyridyl group in its neutral form has a lone pair of electrons which can be donated to form covalent bonds with metals, undergo hydrogen bonding with the polar species and interact with charged surfaces. The various ways in which molecular linker polymer can interact with surfaces makes it universal binding agent for nanostructural assemblies. The use of this polymer is not yet demonstrated to create self-assembled ordered structure of energetic material.

Metal nanoparticles, such as aluminum nanoparticles, are sonicated in alcohol for a time sufficient to achieve homogenous dispersion. The preferred alcohol is 2-propanol, however, the use of other solvents that allow dispersion of the fuel. The ratio of fuel 22 to solvent of about 0.0875 to 0.75 is preferred, though other ratios are useful for other applications.

Referring to FIG. 4, sonication is conducted with any type of sonication equipment 28. Preferably, for synthesis purposes a sonic bath (Cole Parmer Model 8839) is used. The output sound frequency used is in the range of about 50-60 Hz. Duration of the sonication treatment is any time sufficient to remove all of the molecular linker 40 except the layer that is bound to the fuel 22 or the oxidizer 20. Preferably, it is at least 3 hours, and is preferably from about 3 hours to about 16 hours. Centrifugation is preferably combined with sonication to more rapidly remove the excess molecular linker 40.

The steps of sonication followed by centrifugation may be repeated several times to remove excess molecular linker polymer 40 from the fuel 22 or oxidizer 20 particles. The process is repeated as many times as needed. Polymer coated fuel particles, generally 48, result that have a very thin coating of molecular linker polymer 40. Preferably the coating is so thin as to form essentially a polymer monolayer. As a result of this process, the resulting coated fuel particles 48 are preferably from about 50 to about 120 nanometers in diameter. Particle diameters of about 50 to about 80 nanometers are more preferred. Reduction of coated fuel particle 48 diameter below about 18 nanometers results in a particle that has a ratio of fuel 22 to polymer 40 that is too low to burn efficiently.

Self-assembly of the oxidizer 20 nanorods 14 and the coated fuel particles 48 preferably takes place by sonication. Oxidizer 20 nanorods 14 are added to a solvent for several hours. The preferred solvent is 2-propanol, but other solvents for sonication as listed above are also useful. Duration for the sonication treatment is preferably from about 3 hours to about 4 hours. The well-dispersed coated fuel particles 48 were then added to the dispersion of the oxidizer 20 nanorods 14. An additional sonication step was carried out from about 3 hours to about 4 hours. While in the sonicator, the oxidizer 20 and the fuel 22 are thoroughly dispersed. To disperse the fuel 16 and oxidizer 20, a sonic wand with an output frequency of about 55 kHz is used. The time for sonication is about 9 minutes, but longer sonication times are used depending on the specific application. During the dispersion, the fuel particles coated with the molecular linker 48 are likely to encounter and bind with an oxidizer 14 nanorod 20. Since the molecular linker 40 has bonding sites specific for the oxidizer 20, the oxidizer nanorods 14 will bind to the linker 40 on the coated fuel particle 48, holding them in a position to generate a product with a high interfacial surface area. The final solution is then dried to obtain the complete nanocomposite 12.

Preferably, the oxidizer is shaped into a nanorod, nanowire or a structure having a nanowell. In a preferred embodiment, the oxidizer particle is shaped by formation of a crystalline structure inside a micelle of a surfactant. Synthesis of copper oxide nonorods, for example, includes grinding copper chloride dihydrate and sodium hydroxide into fine powders, then added to a polyethylene glycol, such as PEG 400 (Alfa Aesar, Ward Hill, Mass.). After nucleating nanorods inside micelles, the surfactant is removed using solvent extraction followed by annealing.

The nanorods 14 are preferably synthesized inside and take the shape of the micelles of the polymeric surfactant. Nanowells are voids or openings in an oxidizer structure that can be filled with fuel nanoparticles. The nanowells are formed around the exterior of the micelles. Diblock copolymers are known as surfactants having micelles of an appropriate size. Polyethylene glycol, such as PEG 400 by Alfa Aesar is preferred for this task as it has tubular micelles of about 80 nanometers. PEG 400 also produces nanorods of substantially uniform size. As the molecular weight of the polyethylene glycol increases, the diameter of the nanorod changes. Preferably the micelles have an approximate diameter of about 2 nm to about 10 nm. The surfactant is selected by the size of its micelles to produce nanorods of a particular diameter. Addition of water to the surfactant yields a mixture of nanorods of varying length and having a longer average length.

The preferred nanoenergetic materials have flame propagation velocity in excess of speed of sound in the medium so that a shock wave is generated. The shock wave is useful in applications, such as detonation of explosives, microdetonators, for pulverizing kidney stones in the medical field and various other applications. When the chip is designed as a fuse or detonation device, additional energy is conveyed to the explosive substance being detonated. Different arrangements of the fuel and oxidizer produce different flame propagation rates. As shown in Table 1, burn rates vary widely depending on how the oxizider and the fuel are positioned. In all cases, nanoparticles are used, minimizing variation in surface area. When oxidizer particles and fuel particles are randomly mixed, relatively low born rates are obtained. However, when the oxidizer is formed into nanorods or nanowells, burn rates are doubled or tripled. Burn rates measured by on-chip method were verified using conventional approach using an oscilloscope. The burn rates measured by two different techniques are found to be comparable.

TABLE I

Burn rates of various copper oxide based nanocomposites

| Serial Number | Composite | Burn rate, m/s |
|---|---|---|
| 1 | Copper oxide (CuO) nanowells impregnated with Aluminum (Al)-nanoparticles | 2200-2400 |
| 2 | CuO nanorods mixed with Al-nanoparticles | 1500-1800 |
| 3 | CuO nanorods self-assembled with Al-nanoparticles | 1800-2200 |
| 4 | CuO nanorods mixed with 10% ammonium nitrate and Al-nanoparticles | 1900-2100 |
| 5 | CuO nanowire mixed with Al-nanoparticles | 1900 |
| 6 | CuO nanoparticles mixed with Al-nanoparticles | 550-650 |

In some embodiments, it is advantageous to deposit the nanoenergetic material on a second substrate. In such cases, the igniter is preferably also positioned on the second substrate. Deposition of the nanoenergetic material need not be directly on the second substrate. Some embodiments of the invention deposit the igniter between the second substrate and the nanoenergetic material. The nanoenergetic material is considered to be deposited on the second substrate if it is supported by the second substrate, even when there are intervening layers.

Metal oxide oxidizer (e.g. CuO etc) and metal fuel nanoparticles, such as aluminum nanoparticles, are sonicated in alcohol for a time sufficient to achieve homogenous dispersion. The preferred alcohol is 2-propanol, however, the use of other solvents that allow dispersion of the fuel and oxidizer. Amounts of alcohol from about 2.5 ml/g to about 3.7 ml/g of fuel and oxidizer are preferred. Any of the molecular linkers, such as poly (4-vinyl pyridine), available from Aldrich Chemical, (Sigma-Aldrich Co., St. Louis, Mo.) are useful to bond the nanoenergetic material to a second substrate. A solution is prepared having a concentration of about 0.001-0.1% of the molecular linker in 2-propanol and is coated onto the second substrate. Any suitable coating method is usable to coat the molecular linker solution, but spin-coating and dip-coating are preferred.

The molecular linker 40 is coated onto the substrate to bind the nanoenergetic material to the substrate surface. The linker is able to bond with both a fuel and an oxidizer nanoparticles. Preferably, the binding sites are not random, but are spaced to non-randomly intermix the fuel and oxidizer for good interfacial surface area. The molecular linker selected may be the same as or different than the molecular linker used to assemble the nanoenergetic material.

The presence of material other than fuel and oxidizer tends to slow the burn rate of the nanoenergetic material. Cross-linking or bonding of the molecular linker with itself makes is difficult or impossible to remove excess polymer and reduces the burn rate. Thus, another preferred feature of the molecular linker is that it does not bond with itself, allowing excess molecular linker polymer to be removed until essentially a monolayer of molecular linker remains.

After the molecular linker is coated onto the substrate, it is preferably washed in ethanol, then annealed. If used, annealing takes place at temperatures of about 110° C. to about 160° C. for several hours. When the preferred poly (4-vinyl pyridine) molecular linker is used, annealing takes place at about 120° C. for about 4 hours. In embodiments where the nanoenergetic material covers the entire substrate, it is deposited directly onto the molecular linker.

In some embodiments, the target material is sandwiched between the substrate and the nanoenergetic material. In other embodiments, a metal/metal thermite can be sandwiched between the target material and the nanoenergetic material. Other preferred arrangements include a layer of several metal/metal thermites sandwiched between nanoenergetic material and the first substrate coated with the target material. Other ways to position the different structures will be known to an artisan in this field.

The nanoenergetic material is ignited by any means that initiates the self-propagating reaction of the nanoenergetic material. Preferred igniters 38 include platinum resistance heaters but other metal resistance heaters can also be used. Enough energy must be supplied by the igniter to cause the nanoenergetic material to burn. Another criteria that is considered is the physical size of the igniter, which may vary by application. Some applications require the use of a very small apparatus, which in turn requires the use of an igniter that fits on the substrate and allows space for placement of the remaining components. If the igniter is electrically stimulated, it is attachable to bonds at juncture 42.

A pattern for and the heater mounting is laid down on the substrate using well-known masking techniques. In selecting the placement of the electrode pattern, consideration must be made to allow sufficient space on the substrate to create a sufficiently large sample of the nanoenergetic material to achieve its purpose. If the chip is being designed as a test apparatus for burn rates, there must be sufficient space on the chip to make a path of nanoenergetic material sufficient in length to obtain an accurate measurement of the time for the flame to travel the length of the test path.

Optionally, one or more detectors are laid down at the same time as the heater in those embodiments where it is advantageous to detect passage of the moving flame front at one or more points on the chip. Preferably, the detector is a time-varying resistance detector. The pattern for the detector is suitably part of the pattern for the heater. Addition of the detector is useful in applications where the chip is used to test the flame propagation rate or in any situation where it is desirable to know when the flame passes a certain location on the chip.

After the target material has been changed by combustion of the nanoenergetic material, a residue from the nanoenegetic material can be present on the changed target material. The Al etchant removes the residue from the surface after the thermite reaction. A preferred Al etch solution is 85% $H_3PO_4$, 5% $HNO_3$, 5% $CH_3COOH$ and 5% deionized water heated at 40° C.).

In at least one embodiment, the heater and optional detector pattern is transferred by any known method, preferably using a lithography process. Lithography, in the context of building integrated circuits such as DRAMs and microprocessors, is a highly specialized process used to put detailed patterns onto substrates. Referring to FIG. 2, an image containing the desired pattern, such as a mask, is projected onto the substrate, which is coated by a thin layer of a photosensitive resist. When using a positive resist, the bright parts of the image pattern allow chemical reactions which cause the resist material to become soluble. This allows the bright parts of the pattern to dissolve away in a developer liquid, whereas the dark portions of the image remain insoluble. A negative resist allows the dark portions of the image to dissolve and the bright portion of the pattern to become insoluble.

EXAMPLE 1

This example demonstrates the crystallinity of an hydrogenated amorphous silicon ("a-Si:H") layer achieved by the self propagation of nano-energetic material such as CuO/Al and FeO/Al. CuO/Al Metastable Intramolecular compounds (MIC) material can produce very localized heat for a very short period of time. FeO/Al MIC can also produce very localized heat; but, the reaction is slower than CuO/Al. Initial experiments of the ignition of those thermites showed that the substrate did not get heated in the process.

The a-Si:H samples were prepared by Plasma Enhanced Chemical Vapor Deposition (PECVD) on a CORNING® brand glass substrate. The thickness of the a-Si:H layer was 300 nm. A thin layer of platinum was deposited on top of a-Si which acted as a heater for the nano-energetic material. The thermites were coated on top of the a-Si:H and the Pt heater. The diagram of the sample is shown in FIG. 1. The energetic material was ignited by a 30 volt source. After the ignition, the excess material was etched by first acetone and then in piranha solution. After the etching, optical microscope was used for taking photograph of the surface. Raman spectra were measured at room temperature using the 785 mm Ar+ laser line. The power of the laser was 50 mW and the spot size was 5 µm×15 µm.

Figure 6:
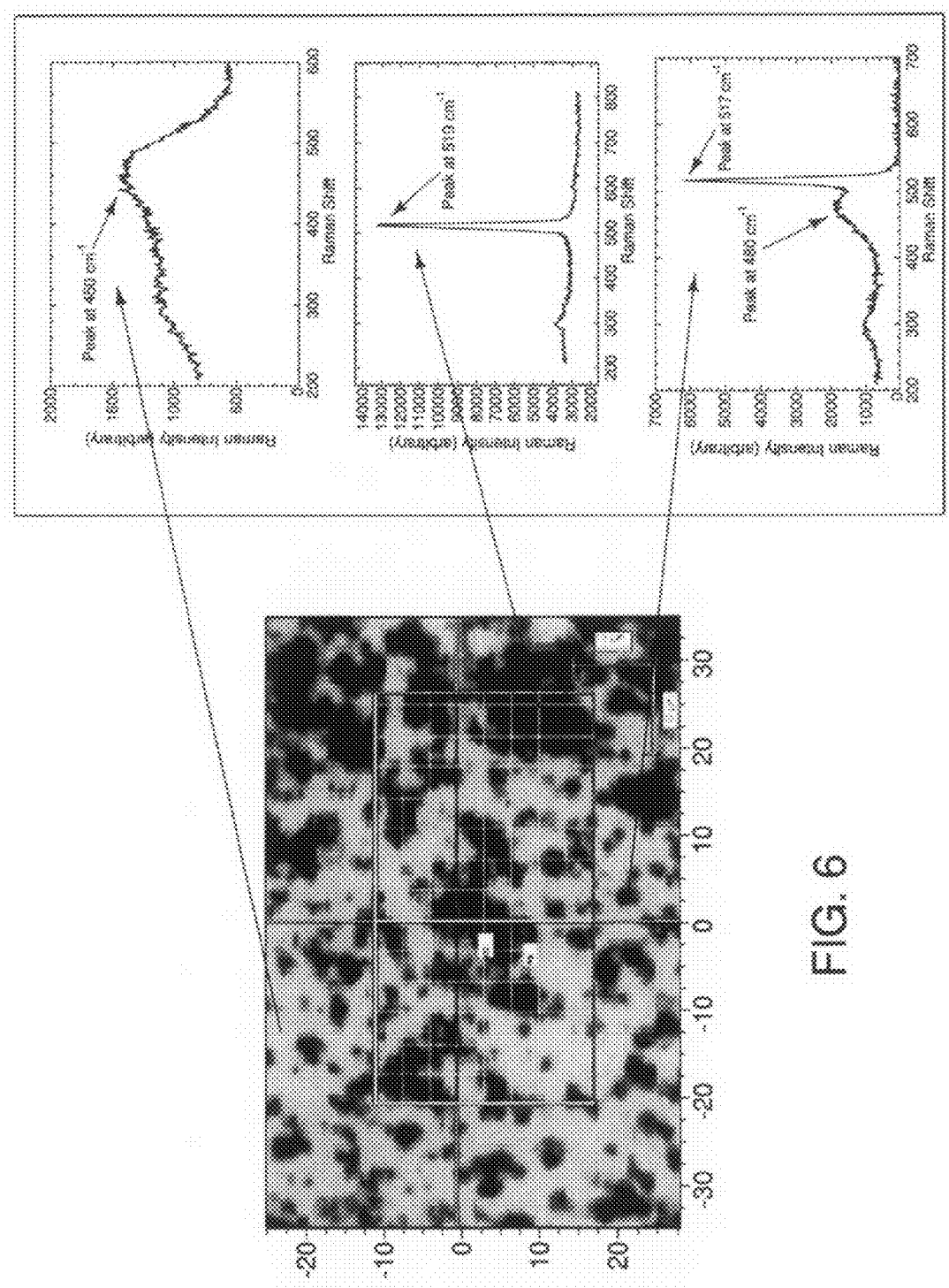
FIG. 6 is a Scanning Electron Micrograph with Raman Mapping of silicon crystallized in Example 1.

FIG. 6 shows optical image where the Raman mapping is done in a 50 µm by 30 µm area. The Raman spectrum in three different regions is also shown in FIG. 6. The lighter area did not show any crystallization, where as the black region showed 100% crystallization. The region with small black spots showed a mixture of crystalline and amorphous Si. The spectrum corresponds to the amorphous Si (light region, top spectrum) can be composed of two Gaussian distributions. One centered at 480 $cm^{-1}$ represents the TO mode with a FWHM of 56 $cm^{-1}$, and the other one centered at 440 cm−1 represents LO mode with a FWHM of 100 $cm^{-1}$. The spectrum for the fully crystallized region (black region, middle spectrum) showed just one peak centered at 519 $cm^{-1}$ with FWHM of 6 cm−1. Spectrum of the mixed region (small black spot, bottom spectrum) showed a peak at 517 $cm^{-1}$ confirming the crystallinity and the peak at 480 $cm^{-1}$ confirms that the sample is not fully crystallized. The data is fitted by the peakFit software with one Lorentzian profile for the crystalline region and two Gaussian profiles for the amorphous and grain boundary region. The fitted data is summarized in Table 2 with value of actual peak position and the FWRM. The glass substrate remained unchanged after crystallization.

TABLE 2

Fitted data for the samples prepared by CuO/Al ignition.

| Peak position (standard) $cm^{-1}$ | Mode/region | FWHM | Peak position from the fit |
|---|---|---|---|
| 520 | TO C—Si | 5.02 | 517 |
| 505-515 | Grain boundary | 14.01 | 515 |
| 480 | TO a-Si | 66.00 | 481 |

From the table it can be seen that the Raman peak of the crystalline silicon is shifted for this particular region, from the actual position of 520 $cm^{-1}$. This shift from 520 to 517 can be attributed due to smaller grain size in the nm range and also due to the thermal stress. Crystal size in the nm range decreases when the FWHM increases. The value of FWHM of our prepared sample is 5 $cm^{-1}$ which is very close to the value of a standard single crystalline sample. This concludes that the shift in the peak position is possibly due to the thermal stress.

EXAMPLE 2

The fast propagating chemical reaction in MIC material generates shock waves and influences the crystallization process. To understand the mechanism of the crystallization, samples were also prepared by introducing a thin Al layer of 45 nm between a-Si:H and thermite. The Al layer reduces the diffusion of thermites into a-Si during reaction. The crystalline volume fraction was reduced to 43% due to heat loss to the Al layer. This clearly verifies that the crystallization was mostly due to the heating effect of the thermite.

EXAMPLE 3

As Raman mapping shows different crystalline fractions for different regions, it is clear that MIC materials contain pores. The mapping shows the presence of micro voids in CuO/Al slurry coated films which result in partial crystallization of a-Si film from self propagating combustion. The micro-level porosity is primarily due to poor particle packing in the film. The nanoparticle consolidation via dispersing route is a challenging problem, where particle interlocking inhibits packing density. Thus, in nanoparticle packing, the boundaries are not well defined leading to micro-level porosity.

Exotic alloy has been prepared using the released energy of the propagation of the MIC materials. For this purpose multiple layers of Pt and Al has been deposited on a glass substrate. Each layer of the structure was 0.5 micron thick. Pt was deposited first on the glass substrate followed by Al. A total of eleven layers have been deposited. Pt and Al together produce self propagating high temperature synthesis reaction; however, initiation of this reaction is very difficult and could not be initiated in our lab like other MIC materials due to the heat loss to the substrate. To initiate the self propagation of the Pt/Al layered structure, MIC materials (CuO/Al) were coated on top of the structure. The ignition of the MIC material is initiated with a Pt heater. The released energy from the self propagation of the MIC material is used to initiate the self propagation of the Pt/Al layers. A cross sectional SEM image of the as prepared sample clearly shows multi-layer structure. An SEM image of the sample after the self propagation reaction shows only one thick layer. The total thickness of this sample was reduced after the reaction. The energy release from this multilayer structure of Pt/Al can also be used to crystallize amorphous materials.

The X-ray diffraction (XRD) analysis was performed on the samples to confirm the formation of alloys. FIG. 5 shows the XRD analysis of the processed sample along with as prepared sample and Al and Pt film. The XRD clearly shows the shift of the peak position after process.

EXAMPLE 4

The a-Si:H samples were prepared by PECVD on a CORNING® brand glass substrate. The thickness of the a-Si:H layer was 300 nm. A thin layer of platinum was deposited on top of a-Si which acted as a heater for the nano-energetic material. The thermites were coated on top of the a-Si:H and the Pt heater. The diagram of the sample is shown in FIG. 1. The energetic material was ignited by a 30 volt source. After the ignition, the excess material was etched by first acetone and then in pirhana solution. After the etching, optical microscope was used for taking photograph of the surface. Raman spectra were measured at room temperature using the 785 mm Ar+ laser line. The power of the laser was 5 mW and the spot size was 3.5 µm×3.5 µm.

EXAMPLE 5

Figure 7:
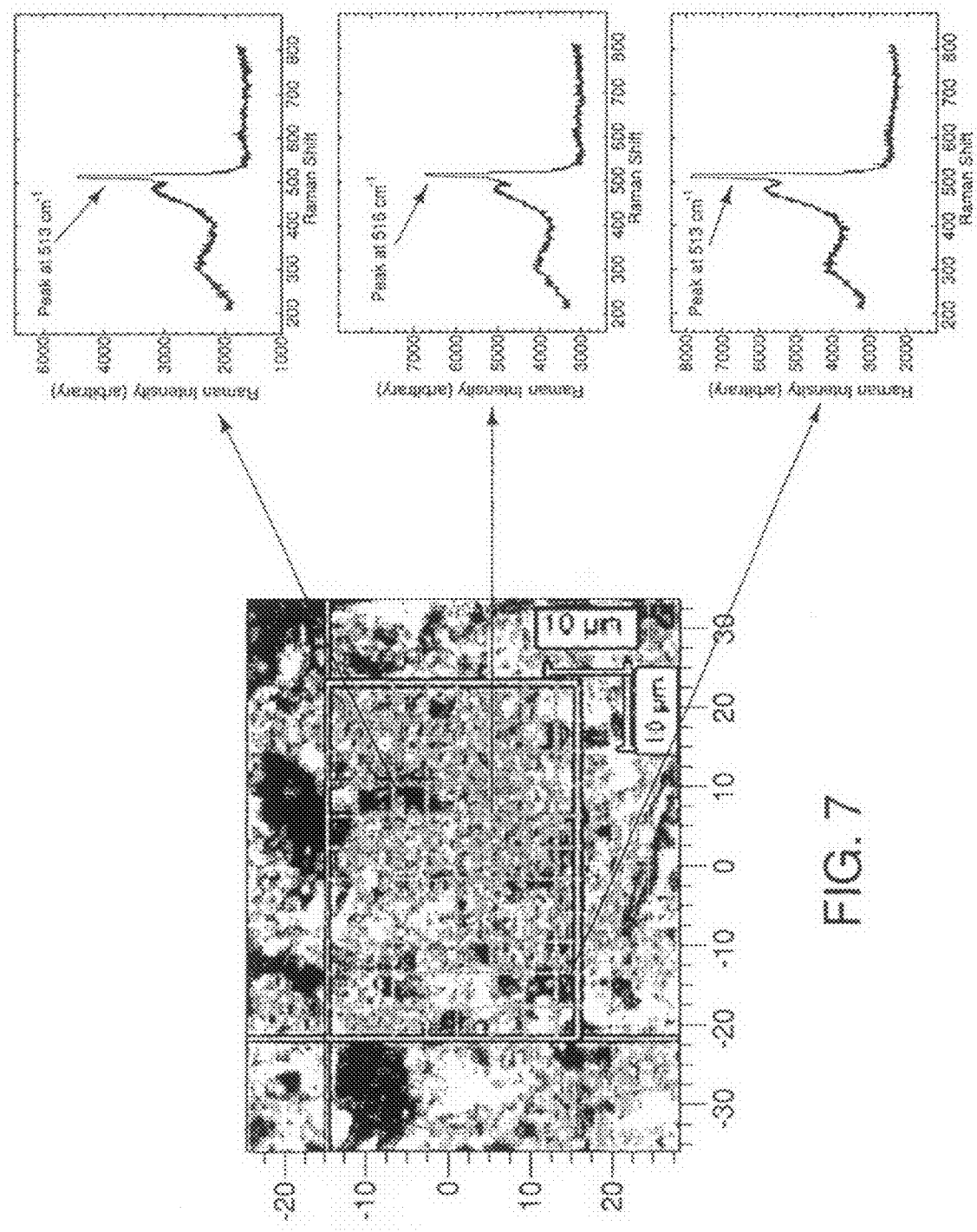
FIG. 7 is a Scanning Electron Micrograph with Raman Mapping of the silicon crystallized in Example 5.

As noted earlier, the crystallized sample by the previous method is not uniformly crystalline; rather it has micro crystals embedded in a-Si. Our goal is to get uniform crystallization. For this purpose samples were prepared by introducing the Pt/Al multilayer structure between a-Si and CuO/Al thermites. After the initiation of the self propagating reaction, the samples were etched in the Al etchant (85% $H_3PO_4$, 5% $HNO_3$, 5% $CH_3COOH$, and 5% DI water heated at 40° C.) to remove the residue of the reaction. Raman mapping was performed on the sample, which shows (FIG. 7) almost uniform crystallization in a 45 µm×35 µm region. The data was measured in 3 µm intervals. The crystalline volume fraction for all the points in the mapping region is calculated to be in the range of 60% to 65% with FWHM of 6 $cm^{-1}$ at a position of 515 $cm^{-1}$. Higher peak shift for this sample suggest having higher residual stress. As the inter metallic or metal/metal thermites propagate slowly and produce less temperature, a-Si gets more time to transfer heat from surface to bottom. Because of this large time and high temperature difference the samples have higher thermal stress. In this example, the substrate was not damaged.

EDS mapping was done on the changed target material along with the SEM image. In the individual mapping, Si shows almost all bright regions, while Cu, Al, and Pt mapping show opposite of Si which is almost all dark with few bright regions. This indicates that there was little Cu, Al and Pt present, and that substantially all of the changed material was Si. The combined mapping shows a continuous layer of Si confirming uniform crystallization with a small amount of Pt, Al and Cu, which are the residue of the thermite reaction and can be removed with proper etchant. The Pt/Al multilayer structure significantly reduced the CuO/Al reaction with Si as there is no direct contact of CuO/Al with a-Si. CuO/Al in this case functions as an igniter for Pt/Al, and a-Si absorbed the released energy from the Pt/Al. The Pt/Al multilayer structure uniformly released the energy as heat from thermite reaction which causes the a-Si to crystallize.

Morphological properties of the films prepared using dual-layer thermites have been investigated by atomic force microscopy (AFM). The measurement was performed with a Nanoscope IIIa (Veeco Instruments, Inc.) operating in the noncontact or tapping mode. Commercial ultra-sharp, rectangular silicon cantilevers made by Micromasch were used having a nominal spring constant of ~0.35-0.70 N/m. We simultaneously recorded AFM images of topography and phase angle (cantilever oscillation relative to the drive) from the samples. FIG. 6 shows the AFM image of the sample prepared with dual-layer thermites for a 5 micron×5 micron region. The image shows uniform crystallization with the grain sizes about 3 micron. As the grain size is larger than 10 nm, the peak shift in the Raman spectrum occurred solely due to the stress.

EXAMPLE 6

An exotic alloy has been prepared using the released energy of the propagation of the MIC materials. For this purpose multiple layers of Pt and Al has been deposited on a glass substrate. Each layer of the structure was 0.5 micron thick. Pt was deposited first on the glass substrate followed by Al. A total of eleven layers alternating Pt and Al were deposited. Pt and Al together produce self propagating high temperature synthesis reaction; however, initiation of this reaction was very difficult and could not be initiated in our lab like other MIC materials due to the heat loss to the substrate. To initiate the self propagation of the Pt/Al layered structure, MIC materials (CuO/Al) were coated on top of the structure. The ignition of the MIC material is initiated with a Pt heater. The released energy from the self propagation of the MIC material is used to initiate the self propagation of the Pt/Al layers. FIG. 7(a) shows the cross sectional SEM image of the layered sample. The image clearly shows multi-layer structure. FIG. 7(b) shows the SEM image of the sample after the self propagation reaction. The image shows only one thick layer. The total thickness for this sample was reduced after the reaction. The energy release from this multilayer structure of Pt/Al can also be used to crystallize amorphous materials.

The X-ray diffraction (XRD) analysis was performed on the samples to confirm the formation of alloys. FIG. 8 shows the XRD analysis of the processed sample along with as prepared sample and Al and Pt film. The XRD clearly shows the shift of the peak position after process.

EXAMPLE 7

Doping of the semi-conducting material can also be achieved by the released energy of the self propagation of the MIC materials. The test sample is an n-type Si wafer from MEMC Electronic Materials, Inc., St. Louis, Mo. A thin layer of spun boron dopant is spin coated on the Si substrate. Nano-engineered CuO/Al energetic material is also spin coated on top of the spin on dopant. The self propagation of the thermites was initiated with the help of an on chip platinum heater. After ignition, the sample is etched in the Al etch solution (85% $H_3PO_4$, 5% $HNO_3$, 5% $CH_3COOH$ and 5% deionized water heated at 40° C.).

While particular embodiments of the method for heating a target material with nanoenergetic materials have been shown and described, it will be appreciated by those skilled in the art that changes and modifications may be made thereto without departing from the invention in its broader aspects and as set forth in the following claims.

What is claimed is:

1. A method of rapidly heating and cooling a target material comprising:
   depositing a target material on a first substrate;
   selecting a self-propagating nanoenergetic material that combusts at temperatures sufficient to change the target material and creates a flame front that propagates sufficiently quickly that the first substrate is not substantially heated;
   depositing the nanoenergetic material on a second substrate;
   positioning the first substrate and the second substrate such that the target material is heated by the nanoenergetic material sufficient to change it;
   igniting the nanoenergetic material;
   allowing the flame front of the nanoenergetic material to propagate over the second substrate and change the target material.

2. The method of claim 1 wherein said first depositing step comprises coating the first substrate with a target material, sputtering the target material onto the first substrate or spreading the target material in the first substrate.

3. The method of claim 1 wherein said igniting step comprises activating one or more of the group consisting of electrodes and thin film resistance heaters.

4. The method of claim 3 wherein said electrode comprises platinum.

5. The method of claim 1 wherein the change in the target material comprises crystallizing, alloying or doping the target material.

6. The method of claim 1 wherein said second depositing step comprises self-assembly of the nanoenergetic material on the surface of the second substrate.

7. The method of claim 1 wherein the change in the target material is crystallization.

8. The method of claim 7 wherein the target material is carbon or silicon.

9. The method of claim 7 wherein the first substrate is at least one of the group consisting of glass and plastic.

10. The method of claim 7 wherein the nanoenergetic material is thermite.

11. The method of claim 1 wherein the change in the target material is alloying the target material with an alloying metal.

12. The method of claim 11 further comprising depositing a layer of an alloying metal on the target material.

13. The method of claim 12 wherein at least one of the at least two metals is selected from the group consisting of platinum and aluminum.

14. The method of claim 11 wherein the nanoenergetic material is thermite.

15. The method of claim 1 wherein the change in the target material is doping of the target material with a dopant.

16. The method of claim 15 wherein the target material is selected from the group consisting of gallium arsenide, silicon and germanium.

17. The method of claim 15 wherein the dopant is selected from the group consisting of boron, phosphorus, arsenic and antimony.

18. The method of claim 15 wherein the nanoenergetic material is thermite.

19. The method of claim 1 wherein the nanoenergetic material is patterned on a second substrate.

20. The method of claim 1 wherein the change in the target material in the selecting step is a phase change; and the target material is at least one of the group consisting of graphite, carbon nanotubes and fullerenes.

21. The method of claim 1 wherein the nanoenergetic material is a mixture of at least two of nanorods, nanowells and nanospheres.

* * * * *